United States Patent
Givens et al.

(10) Patent No.: US 6,267,852 B1
(45) Date of Patent: *Jul. 31, 2001

(54) METHOD OF FORMING A SPUTTERING APPARATUS

(75) Inventors: John H. Givens, Meridian; Shane B. Leiphart, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/535,764

(22) Filed: Mar. 28, 2000

Related U.S. Application Data

(63) Continuation of application No. 09/149,705, filed on Sep. 8, 1998, now Pat. No. 6,051,121, which is a continuation of application No. 08/589,166, filed on Jan. 22, 1996, now Pat. No. 5,807,467.

(51) Int. Cl.$^7$ .................................................. C23C 14/34
(52) U.S. Cl. ........................ 204/192.12; 204/192.13; 204/192.3; 204/298.06; 204/298.08; 204/298.11; 204/298.14
(58) Field of Search ............................ 204/192.1, 192.12, 204/192.13, 298.06, 298.08, 298.11, 298.14, 192.3

(56) References Cited

U.S. PATENT DOCUMENTS

| | | | |
|---|---|---|---|
| 4,243,865 | 1/1981 | Saxena | 204/192.3 X |
| 4,585,517 | 4/1986 | Stemple | 204/192.3 X |
| 4,717,462 | 1/1988 | Homma et al. | 204/298.06 |
| 4,816,126 | 3/1989 | Kamoshida et al. | 204/192.3 |
| 4,913,789 | 4/1990 | Aung | 204/192.3 |
| 4,999,096 | * 3/1991 | Nihei et al. | 204/298.06 |
| 5,089,441 | 2/1992 | Moshlehi | 437/225 |
| 5,108,570 | 4/1992 | Wang | 204/192.3 |

(List continued on next page.)

OTHER PUBLICATIONS

IBM Technical Disclosure Bulletin, "A Method . . . ULSI Applications," vol. 37, No. 06A, Jun. 1994, pp. 463–464.

Wolf, "Multilevel–Interconnect Technology for VLSI and ULSI," *Silicon Processing in the VLSI Era*, vol. 2, p. 219, 1986.

Nender, et al., "Selective Deposition of Ti: An Interface Study," Inst. of Tech., Uppsala Univ., Uppsala, Sweden, Sci. Tech. A, vol. 5, No. 4, Jul./Aug. 1987.

*Primary Examiner*—Rodney G. McDonald
(74) *Attorney, Agent, or Firm*—Workman, Nydegger & Seeley

(57) ABSTRACT

Disclosed is a method of forming a PVD deposition chamber which is modified with an electrical circuit that allows a voltage bias to be applied to any one or more of a target, an in-process integrated circuit wafer, and collimator. The collimator can also be isolated from the electrical circuit. This configuration allows a preclean of the in-process integrated circuit wafer in situ in the PVD deposition chamber by ion sputtering and a subsequent sputter deposition through the collimator.

A method is also disclosed wherein an in-process integrated circuit wafer is first precleaned in the PVD deposition chamber by applying a negative voltage bias to the in-process integrated circuit wafer. A film of conducting material is then sputter deposited on the surface of the in-process integrated circuit wafer by applying a negative voltage bias to the target. The collimator is electrically isolated during this process or is set at a higher potential than the in-process integrated circuit wafer. A voltage bias can also be applied to the in-process integrated circuit wafer during the deposition, and its magnitude proportioned to modify the morphology of the film being deposited. Once the deposition is conducted, a negative voltage bias can be applied to the collimator to sputter clean the collimator.

39 Claims, 3 Drawing Sheets

U.S. PATENT DOCUMENTS

| | | | |
|---|---|---|---|
| 5,171,412 | 12/1992 | Talieh et al. | 204/298.11 X |
| 5,330,628 | 7/1994 | Demaray et al. | 204/192.3 X |
| 5,391,394 | 2/1995 | Hansen | 427/124 |
| 5,403,459 | 4/1995 | Guo | 204/298.11 X |
| 5,409,587 * | 4/1995 | Sandhu et al. | 204/192.12 |
| 5,728,276 * | 3/1998 | Katsuki et al. | 204/298.11 |
| 5,807,467 * | 9/1998 | Givens et al. | 204/192.12 |
| 6,051,121 * | 4/2000 | Givens et al. | 204/298.06 |

* cited by examiner

METHOD OF FORMING A SPUTTERING APPARATUS

This is a continuation of U.S. patent application Ser. No. 09/149,705, filed on Sep. 8, 1998, U.S. Pat. No. 6,051,121 which is a continuation of U.S. patent application Ser. No. 08/589,166, filed on Jan. 22, 1996, U.S. Pat. No. 5,807,467 both of which are incorporated herein by reference.

BACKGROUND OF THE INVENTION

1. The Field of the Invention

The present invention relates to the deposition of conducting materials on silicon substrates in integrated circuit manufacturing processes. More particularly, the present invention is directed to conducting material deposition methods with corresponding cleaning techniques which can be conducted in situ in a deposition chamber in integrated circuit manufacturing processes.

2. The Relevant Technology

The integrated circuit manufacturing industry is rapidly progressing in its attempts to miniaturize integrated circuits. This progress is resulting in the development of new electronics products with highly enhanced capabilities. In order to continue in this progression, however, new processes are needed for producing integrated circuits with greater efficiency, greater flexibility, lower power consumption, and lower cost. As an example, one process which must be improved in order to continue the progress being made comprises the deposition of conducting materials on the surface of in-process integrated circuit wafers. When so doing, there is often a need prior to the deposition to remove a native oxide layer which grows on silicon surfaces as a result of a reaction with oxygen. The native oxide layer is insulative and is undesirable as it increases the resistivity of the interface. Other impurities are often present on the surface and must likewise be removed.

Typical processes for removing native oxide layers comprise, for instance, a hydrofluoric acid chemical bath. The hydrofluoric acid chemical bath is typically conducted in a cleaning chamber. After the hydrofluoric acid chemical bath and subsequent drying, the in-process integrated circuit wafer is transferred from the cleaning chamber to a deposition chamber for deposition of a conducting material.

Other processes for removing the native oxide and other impurities comprise plasma etching in a chamber such as a high density plasma etching chamber. This process typically comprises evacuating the high density plasma etching chamber to a low pressure, applying a voltage bias to the in-process integrated circuit wafer, and introducing an inert gas into the high density plasma etching chamber. The inert gas is ionized through collisions with electrons, and the positive ions are accelerated toward the in-process integrated circuit wafer, impacting and dislodging impurities from the surface thereof in a plasma etch. Once again, after the plasma etch is concluded, the in-process integrated circuit wafer is transferred to the deposition chamber.

The deposition of conducting materials, such as the electrically conducting materials of titanium and aluminum, is typically conducted with the use of a type of physical vapor deposition (PVD) known as sputter deposition. In sputter deposition, the in-process integrated circuit wafer is located at the bottom of a PVD deposition chamber and a target formed of the conducting material to be deposited is placed at the top of the PVD deposition chamber. A negative voltage bias is applied to the target, the PVD deposition chamber is evacuated to a low pressure, and an inert gas such as argon is introduced into the PVD deposition chamber. Electrons are separated from the argon atoms due to collisions, and the argon atoms become positively ionized. The argon ions are accelerated toward the target by the voltage bias, impacting and dislodging atoms of the conducting material. The dislodged atoms of the target are expelled with an energy that carries them to the surface of the in-process integrated circuit wafer, where they are deposited.

A collimator is used in order to direct the atoms expelled from the target straight down to the in-process integrated circuit wafer surface so as to maintain high step coverage of geometrical features formed on the surface of the in-process integrated circuit wafer. The collimator comprises an array of tubes located between the target and the in-process integrated circuit wafer. Only atoms that are expelled from the target with a substantially normal angle of incidence to the target pass through the center of the tubes of the collimator and continue on to the in-process integrated circuit wafer. The atoms expelled with an angular trajectory are blocked by the walls of the collimator. This assures that a uniform step coverage of the conducting material over the geometrical features on the surface of the in-process integrated circuit wafer is maintained A major drawback of prior art deposition processes is that removing the native oxide layer prior to deposition requires an additional chamber. Consequently, more equipment and clean room space are required, at a greater expense. Transferring the in-process integrated circuit wafers between multiple chambers also takes more time, lowering the throughput of the integrated circuit manufacturing process.

A further drawback of current deposition processes is the occurrence of cusping. An example of cusping is illustrated in FIG. 1. Therein can be seen a silicon substrate 10 of an in-process integrated circuit wafer. A surface 12 on the silicon substrate is shown patterned with a contact opening 14. A film 16 has been deposited over surface 12 by a process such as the PVD sputter deposition process discussed above. A large buildup of the sputtered conducting material at the surface of contact opening 14 during the sputter deposition of film 16 has caused the occurrence of cusps 18. Cusps 18 eventually close over the surface of contact opening 14, resulting in a keyhole 20 in the center of contact opening 14. Keyhole 20 increases the contact resistance of the contact being formed, which results in slower device performance, which can in turn result in a failure condition of the integrated circuit. Also, keyhole 20 can open up during later processing steps and allow caustic materials inside, which will erode film 16, also resulting in a failure condition.

Consequently, a need exists in the art for a deposition process whereby the time, space, and expense of the separate chamber necessary for the precleaning step can b eliminated. Such a process would be exceptionally advantageous if it were compatible with conventional PVD sputtering processes, and especially if compatible with collimated PVD sputtering processes. It would also be highly advantageous if the deposition process and preclean could be conducted in a manner whereby the deposition rate and qualities of the conducting material being deposited, and the morphology of the resulting film could be controlled, and whereby the incidence of cusping and keyhole formation could be avoided.

SUMMARY AND OBJECTS OF THE INVENTION

The present invention seeks to resolve the above and other problems which have been experienced in the art. More particularly, the present invention constitutes an advancement in the art by providing a method for cleaning a silicon substrate of impurities prior to the deposition of a conducting material, which achieves each of the objectives listed below.

It is an object of the present invention to provide a method for cleaning a silicon substrate of impurities prior to the deposition of a conducting material, wherein the cleaning step and the subsequent deposition step can both be conducted in the same chamber, thus eliminating the need for additional equipment and space, and eliminating the step old transferring the in-process integrated circuit wafer between chambers, thereby increasing the throughput of the integrated circuit manufacturing process.

It is also an object of the present invention to provide such a method with which a conventional PVD sputter deposition with a collimator can be utilized for the deposition step.

It is additionally an object of the present invention to provide such a method with which a voltage bias can be applied to both an in-process integrated circuit wafer and a target, and wherein the relative voltage bias levels of the in-process integrated circuit wafer and the target can be adjusted, such that the deposition rate and morphology qualities of a film of the conducting material being deposited can be controlled.

It is also an object of the present invention to provide such a method with which the adhesion to an underlying surface of a deposited film can be improved by roughening the surface prior to deposition.

It is further an object of the present invention to provide such a method with which step coverage can be improved through the reduction of the incidence of cusping and with which keyhole formation can be eliminated.

It is yet another object of the present invention to provide such a method with which the location of ionization plasma can be controlled for more effective cleaning.

It is still another object of the present invention to provide such a method with which a voltage bias can be applied to the collimator in order to sputter clean accumulated target material from the collimator.

It is still another object of the present invention to provide a PVD deposition chamber in which a surface can be precleaned and with which a conducting material can be sputter deposited over the surface through a collimator.

To achieve the foregoing objects, and in accordance with the invention as embodied and broadly described herein in the preferred embodiment, a process is provided for precleaning a surface in situ in the deposition chamber in preparation for a later deposition of a film over the surface. A novel chamber for conducting both the preclean and the deposition is also provided. The chamber has the additional capabilities of controlling the morphology of the film deposited by the deposition operation and of sputter cleaning the collimator.

The PVD deposition chamber of the present invention is modified with an electrical circuit and a voltage source that allow a voltage bias to be applied to any one or more of a target, an in-process integrated circuit wafer, and a collimator. The collimator is also capable of being electrically isolated from the circuit. This configuration allows a preclean of the in-process integrated circuit wafer in situ in the PVD deposition chamber by ion sputtering, and then a subsequent sputter deposition through the collimator without a loss of energy of the sputtered material. It also allows for situating an ionization plasma in a desired location and for sputter cleaning the collimator.

The method of the present invention has a first step comprising preparing a surface on the in-process integrated circuit wafer which is to be cleaned and to have a film deposited on it. This typically comprises forming the surface on a silicon substrate of an in-process integrated circuit wafer and patterning the surface if necessary. In a further step, the in-process integrated circuit wafer with the surface on it is placed in the PVD deposition chamber. The PVD deposition chamber can be of a single wafer or multiple wafer design. Typically the in-process integrated circuit wafer is clamped or other wise retained to a wafer holder in the PVD deposition chamber.

In a next step, a voltage bias is applied to the in-process integrated circuit wafer. This is accomplished in one embodiment with an electrical circuit. The electrical circuit connects the voltage source with the wafer holder and is used to apply a negative voltage bias to the wafer holder. The collimator can be isolated from the electrical circuit during this step, or a voltage bias can be applied to the collimator with the electrical circuit. Applying a voltage bias to the collimator during the deposition step having a less negative potential than the voltage bias on the in-process integrated circuit wafer positions the ionization plasma close to the in-process integrated circuit wafer. A close plasma to the in-process integrated circuit wafer is more effective in cleaning once the cleaning process is initiated by striking a plasma for a plasma etch of a surface to be cleaned on the in-process integrated circuit wafer.

The in-process integrated circuit wafer is then precleaned in situ in the PVD deposition chamber by flowing an inert gas such as argon into the PVD deposition chamber. Thus, a step of transferring the in-process integrated circuit wafer through separate chambers between the preclean and the deposition steps is eliminated. Also, less equipment and space in the clean room are required.

Once the surface is cleaned, a sputter deposition is conducted in the same PVD deposition chamber. In so doing, a film of conducting material is sputter deposited on the surface of the in-process integrated circuit wafer by applying a negative voltage bias to the target and flowing an ionized gas into the PVD deposition chamber. The collimator is electrically isolated during this process or is set at a higher potential than the in-process integrated circuit wafer. A voltage bias can also be applied to the in-process integrated circuit safer during the deposition, and its magnitude proportioned to modify the morphology of the film being deposited Thus, the density, grain size, grain size regularity, and other morphology qualities of the film can be controlled through the present invention Applying a voltage bias to the in-process integrated circuit wafer during deposition also tends to reduce buildups of sputtered material, and consequently effectively eliminates cusping and keyhole formation and maintains a consistent step coverage.

By electrically isolating the collimator or placing it at a higher potential than the in-process integrated circuit wafer, the collimator can be used during the deposition process without reducing the energy of the inert gas bombarding the target. This is beneficial, as a high energy is desirable in maintaining proper morphology qualities.

Once the deposition is conducted, a negative voltage bias can be applied to the collimator to sputter clean the collimator. This causes a bombardment of the collimator and reduces the buildup of sputtered material from the collimator between deposition operations. Removing the buildup maintains a consistent size of the tube openings in the collimator hereby keeping the angle of incidence of sputtered material passing through the collimator within a constant range. This results in a more consistent step coverage of the film and increases throughput by eliminating the need to dismantle the chamber and manually clean or replace the collimator.

Thus, the present invention eliminates a transfer step of the integrated circuit manufacturing process, reduces space and equipment in the clean room, assists in controlling the morphology of the deposited film, and maintains consistent step coverage of the deposited film. It also increases throughput by eliminating the need to manually clean or replace the collimator frequently.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENT

The present invention incorporated the concept that an ion sputter preclean, also called a plasma etch, can be conducted in situ in a PVD deposition chamber having disposed therein a collimator The in situ ion sputter preclean is achieved by connecting a wafer holder and a target in the PVD deposition chamber with an electrical circuit and a voltage source through which a voltage bias can be applied to either. It is also achieved in part dut to the novel structure of the PVD deposition chamber. This novel structure includes a collimator that can be connected into the circuit for applying a voltage bias to control the location of ionization plasma and for cleaning of the collimator. The collimator can also be electrically isolated from the circuit, such that it does not interfere with the energy of inert gas and consequently the sputtered material which must pass through the collimator.

Figure 2:
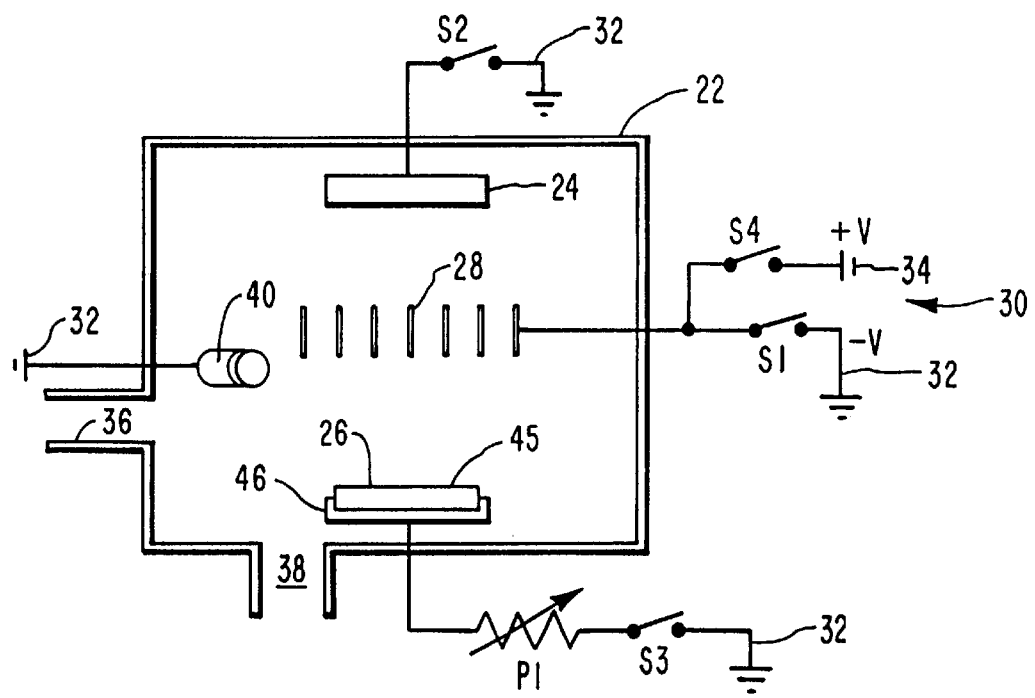
FIG. 2 is a schematic representation of a PVD deposition chamber modified in accordance with the present invention.

In accordance with the present invention, a modified PVD deposition chamber 22 is provided as shown in FIG. 2. PVD deposition chamber 22 is provided with a target 24, an in-process integrated circuit wafer 26, and a collimator 28. PVD deposition chamber 22, before modification of the same, can be of any suitable make. One preferred PVD deposition chamber model is the Endura, sold by Applied Materials Systems Co. of Santa Clara, Calif.

PVD deposition chamber 22 is modified in that target 24, in-process integrated circuit wafer 26, and collimator 28 are linked in electrical communication by an electrical Circuit 30. Electrical circuit 30 is provided with ground nodes 32 which can be connected to each of target 24, in-process integrated circuit wafer 26, and collimator 28, such that negative voltage biases can be provided to any of target 24, in-process integrated circuit wafer 26, and collimator 28. A positive power source 34 is also provided and connected in such a manner that appositive voltage bias can be applied to at least collimator 28 and electrode 40. Electrode 40 is used as a positive reference voltage in creating the voltage bias on target 24, in-process integrated circuit wafer 26, or cimator 28. Electrical switches are located in electrical circuit 30 such that the voltage biases can be turned on and off, and so that each of the aforementioned components can be electrically isolated. Thus, in the depicted embodiment, a switch S1 is used for electrically isolating collimator 28, a switch S2 is used for electrically isolating target 24, and a switch S3 is used for electrically isolating in-process integrated circuit wafer 26.

An inlet aperture 36 allows an inert gas to enter into PVD deposition chamber 22 to provide an ionization source. The inert gas preferably comprises an element from the column of the noble gases of the periodic table, such as argon, neon, and xenon. Most preferred is argon for its weight, availability, and low cost. Also included in PVD deposition chamber 22 is an evacuation aperture 38 through which a vacuum is created.

PVD deposition chamber 22 can be connected in a diode configuration, as shown in FIG. 2, with electrode 40 providing the anode, and one of the target 24, in-process integrated circuit wafer 26, or collimator 28 providing the cathode. Alternately, the electrical voltage biasing circuit of the PVD deposition chamber can be connected with a triode configuration. In the triode configuration, a means for externally creating a voltage bias is provided in the form of a third electrode in inlet aperture 36. PVD deposition chamber 22 could also be connected in a magnetron configuration, which is known in the art.

In order to aid in selecting the location of the ionization plasma, the location of electrode 40 could be capable of varying, or multiple electrodes could be used. Cathodes are attached to each of target 24, wafer holder 46, and collimator 28. The anodes and cathodes, which are currently active, can be selectively employed. In this manner, voltage biases can be applied separately to target 24, in-process integrated circuit wafer 26, or collimator 28.

Figure 3:
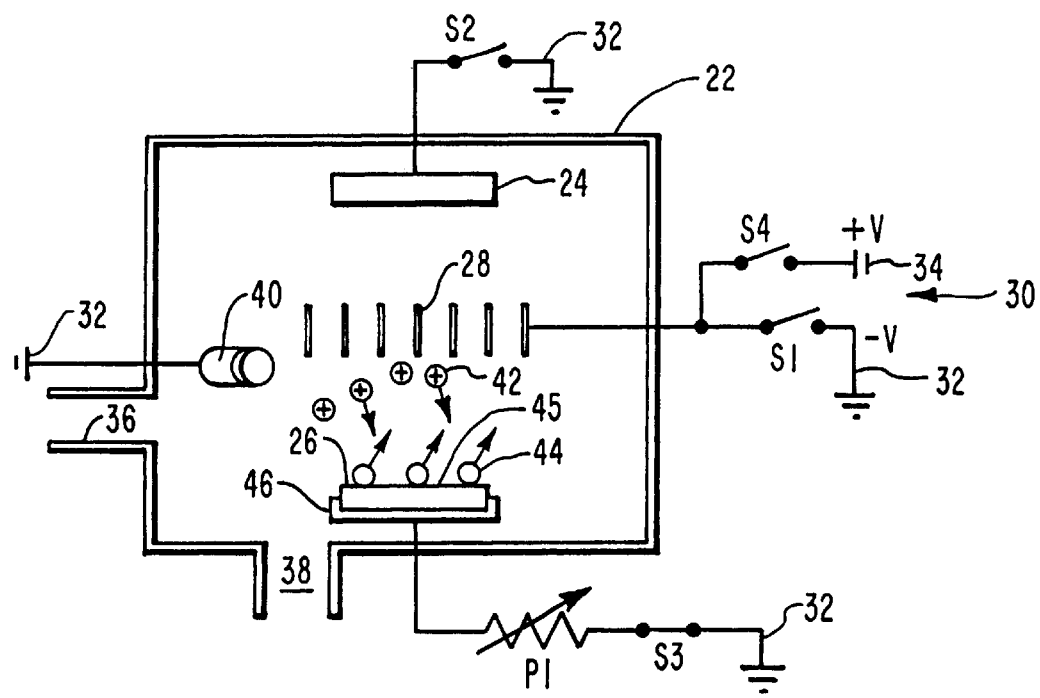
FIG. 3 is a schematic representation of the PVD deposition chamber of FIG. 1 shown during a process of precleaning an in-process integrated circuit wafer surface.

FIG. 3 shows PVD deposition chamber 22 configured for precleaning surface 45 on in-process integrated circuit wafer 26. Switch S3 is shown closed, and a negative voltage bias is applied to in-process integrated circuit wafer 26. Switches S1 and S4 are shown open so that collimator 28 is electrically isolated from electrical circuit 30. In an alternative embodiment, switch S4 can be closed, providing a positive potential or a less negative potential on collimator 28. This confines the ionization plasma between collimator 28 and wafer 26.

Figure 4:
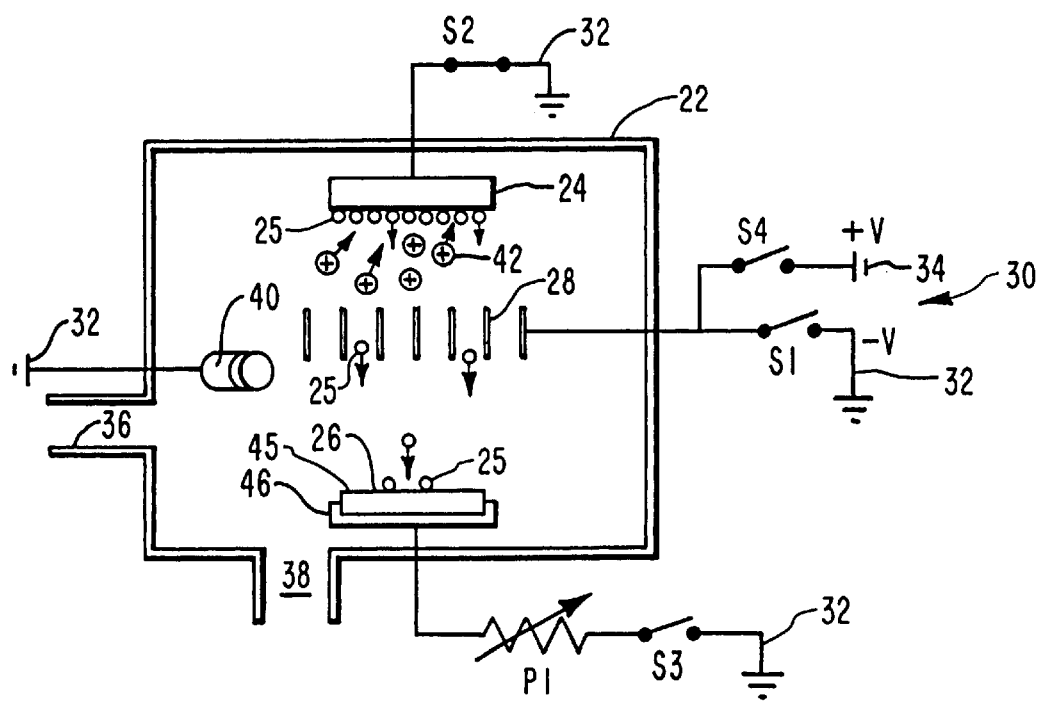
FIG. 4 is a schematic representation of the PVD deposition chamber of FIG. 1 shown during a process of depositing a conducting material on an in-process integrated circuit wafer surface.

FIG. 4 illustrates the capability of PVD deposition chamber 22 of depositing a film on surface 45 of in-process integrated circuit wafer 26. For conducting deposition operations, target 24 is connected to have a negative voltage bias. This can be created by grounding target 24 and applying a positive power source 34 to anode 40 or to in-process integrated circuit wafer 26. The inventors have discovered that in order to best strike an ionization plasma between in-process integrated circuit wafer 26 and target 24, collimator 28 must be electrically isolated from electrical circuit 30. An arrangement where collimator is electrically isolated is shown in FIG. 4. Alternatively, connecting collimator 28 into electrical circuit 30 creates a secondary voltage bias that serves to alter the location of the ionization plasma. It also reduces the energy of the inert ionized gas which must pass through collimator 28. This might be useful in some incidences to alter the film density and morphology.

Figure 5:
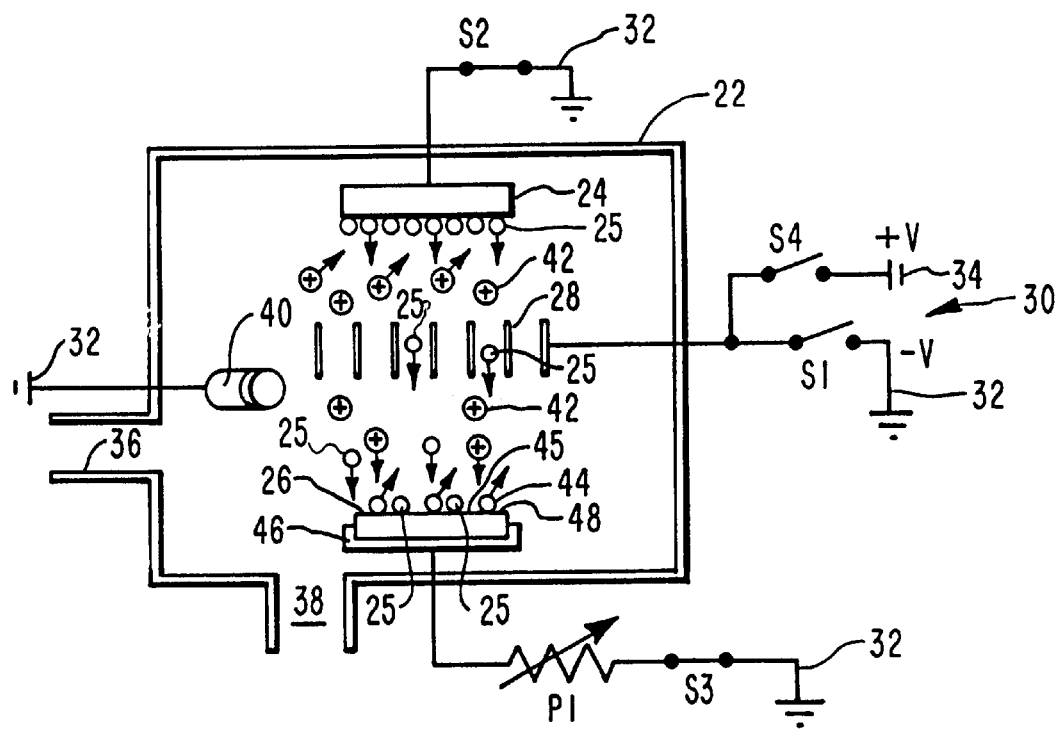
FIG. 5 is a schematic representation of the PVD deposition chamber of FIG. 1 shown during a process of depositing a conducting material on an in-process integrated circuit wafer using a concurrent biasing of the in-process integrated circuit wafer surface to control the deposition rate and qualities of a film being deposited.

FIG. 5 illustrates an alternative embodiment where a voltage bias is supplied to both target 24 and in-process integrated circuit wafer 26 and where the ratio of the two voltage biases can be varied. The capability of adjusting the voltage bias between target 24 and in-process integrated circuit wafer 26 allows for control of specific morphology qualities of the deposited film. These morphology qualities include the density, adhesion, grain size, grain size regularity, electrical properties, and preferred orientation. The morphology qualities can be affected in several ways. One way is through controlling the energy of impinging sputtered material 25, which is determined in part by the voltage bias rate on target 24 and on the electrical connection of collimator 28. Applying a voltage on in-process integrated circuit wafer 26 can also improve mobility of atoms on the film surface, much the same as would occur if in-process integrated circuit wafer 26 were heated. This allows for better arrangement of the film, and a smaller and more consistent grain size.

Figure 1:
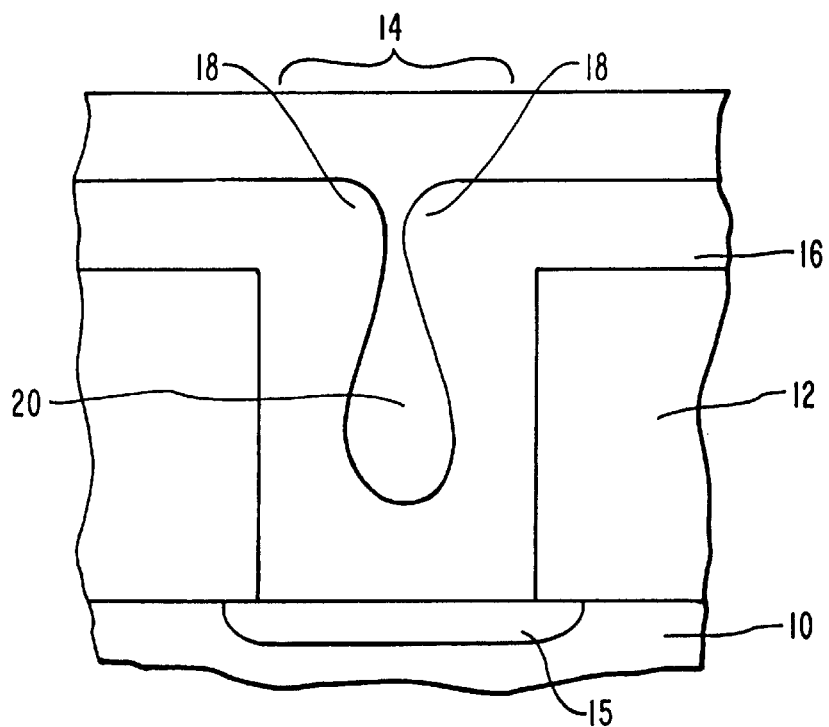
FIG. 1 is a schematic cross-sectional representation of a contact opening on an in-process integrated circuit wafer surface showing the prior art problem of cusping at the surface of the contact opening.

A further benefit of applying a voltage bias to in-process integrated circuit wafer 26 during deposition is that it tends to reduce buildups of sputtered material 25. Thus, buildups such as cusps 18 of FIG. 1 are removed, and keyholes such as keyhole 20 of FIG. 1 do not form. Consequently, uniform and consistent step coverage is provided.

In accordance with the present invention, a process is also provided, whereby a preclean operation can be conducted for precleaning surface 45 on in-process integrated circuit wafer 26 and whereby a subsequent sputter deposition of a film onto surface 45 can also be conducted without the necessity of transferring in-process integrated circuit wafer 26 between separate chambers. The process uses a PVD deposition chamber 22 constructed in substantially the same manner as shown in FIG. 2 and as described above. Other capabilities such as the ability to clean collimator 28 between depositions are also included in the method of the present invention due to the ability to electrically isolate collimator 28 or make it part of electrical circuit 30, and the ability to modulate the ratio of the voltage bias between target 24 and in-process integrated circuit water 26.

The first step of the process of the present invention comprises connecting PVD deposition chamber 22 so that a voltage bias can be applied to at least target 24 and in-process integrated circuit wafer 26. Such a configuration is shown in FIG. 3. The voltage bias in the present embodiment is negative, and is created between power supply 34 and ground node 32 on wafer holder 46. It is also preferred that collimator 28 be connected in a manner whereby it can be electrically isolated. This is typically done by opening switches S1 and S4, as also described above and shown in FIG. 3. It is also preferred that collimator 28 be connected such that either a negative or a positive bias can be applied to it. Thus, closing switch S1 applies a negative bias to collimator 28, and closing switch S4 applies a positive bias to collimator 28.

The next step comprises preparing a surface such as surface 45 on in-process integrated circuit wafer 26 on which the deposition is to occur. Thus, surface 45 of in-process integrated circuit wafer 26 is formed and patterned if necessary. Next, in-process integrated circuit wafer 26 is placed in PVD deposition chamber 22. In so doing, in-process integrated circuit wafer 26 is typically placed in wafer holder 46, which is connected in electrical communication with electrical circuit 30 of PVD deposition chamber 22, such that it forms a cathode for applying an electrical voltage bias to the in-process integrated circuit wafer.

PVD deposition chamber 22 is then evacuated by applying a vacuum through vacuum aperture 38. Once in-process integrated circuit wafer 26 is placed in PVD deposition chamber 22 and PVD deposition chamber 22 is evacuated, an inert gas is passed into PVD deposition chamber 22, and a negative voltage bias is applied to in-process integrated circuit wafer 26 through wafer holder 46 in order to sputter clean surface 45 on in-process integrated circuit wafer 26. A sputter cleaning operation is illustrated in FIG. 3. In the sputter cleaning operation, ions 42 are accelerated by the voltage bias toward surface 45 of inprocess integrated circuit wafer 26, impacting surface 45 of in-process integrated circuit wafer 26 and dislodging impurities 44 from surface 45.

When creating the voltage bias, a positive voltage can be applied to electrode 40, or a positive voltage bias can be applied to target 24, while either a negative potential or a ground is applied to wafer holder 46. Collimator 28 is electrically isolated by upendig switches S1 and S4, or optionally, a positive voltage bias can also be applied to collimator 28 during the cleaning step by closing switch S4. By applying a positive bias to collimator 28, the iQnization plasma is confined close to target 24. This is beneficial, as it reduces the magnitude of the potential that must be applied to anode 40 and the vtltage bias on in-process integrated circuit wafer 26 in order to create a sufficient ionization plasma. Applying a large,voltage bias to in-process integrated circuit wafer 26 risks damaging any electrical devices that are formed on the surface from previous processes. Additionally, containing the ionization plasma close to in-process integrated circuit wafer 26 allows more effective sputtering of in-process integrated circuit wafer 26.

Native oxides as well as other impurities 44 are removed from surface 45 by ions 42 as a result of the voltage bias. This provides a clean interface on surface 45 to which the film of sputtered material 32 will adhere Surface 45 is also roughened or "damaged," by the sputtered ions, in order to provide nucleation sites for the film being deposited. This results in smaller grain sizes and a smoother film. Grain sizes have also been found to be more uniform as a result. Adhesion of the deposited film to surface 45 will also be improved due to mechanical interlocking with roughened surface 45.

The next step is to sputter deposit a film of conducting material 25 onto surface 45. This is done in ctne embodiment, shown in FIG. 4, by terminating the voltage bias on in-process integrated circuit wafer 26 and applying a negative voltage bias to target 24 and electrically isolating collimator 28 by opening switch SI. The sputter deposition is then conducted in a conventional manner, with collimator 28 limiting the angle of incidence of sputtered material 25 so that proper step coverage is maintained.

A voltage bias could also be applied to collimator 28. This could be done with a positive or slightly negative voltage bias on collimator 28, and doing so would alter the energy with which sputtered material 25 impacts surface 45, altering the film morphology. It could also be used to strike a secondary ionization plasma close to in-process integrated circuit wafer 26 for a sputtering during the deposition that would alter the morphology of the deposited film and improve step coverage by reducing cusping, as discussed above.

As a further option enabled by the present invention, when sputter depositing, a voltage bias can be applied to in-process integrated circuit wafer 26 as well as to target 24, as shown in FIG. 5 and discussed above. The relative voltage bias potentials of in-process integrated circuit wafer 26 and target 24 can be scaled by varying potentiometer P I in this embodiment, so that a net deposition occurs on surface 45 of in-process integrated circuit wafer 26, but also so that the film being deposited has specific morphology qualities, resulting from the voltage bias. By varying the ratio of the voltage biases, the deposition rate can be varied, and the aforementioned morphology qualities can be controlled. When generating a plasma by means other than a DC bias, such as with an AC bias or RF, appropriate corresponding methods are used to vary the relative levels of bias applied to in-pocess integrated circuit wafer 26 and target 24.

Figure 6:
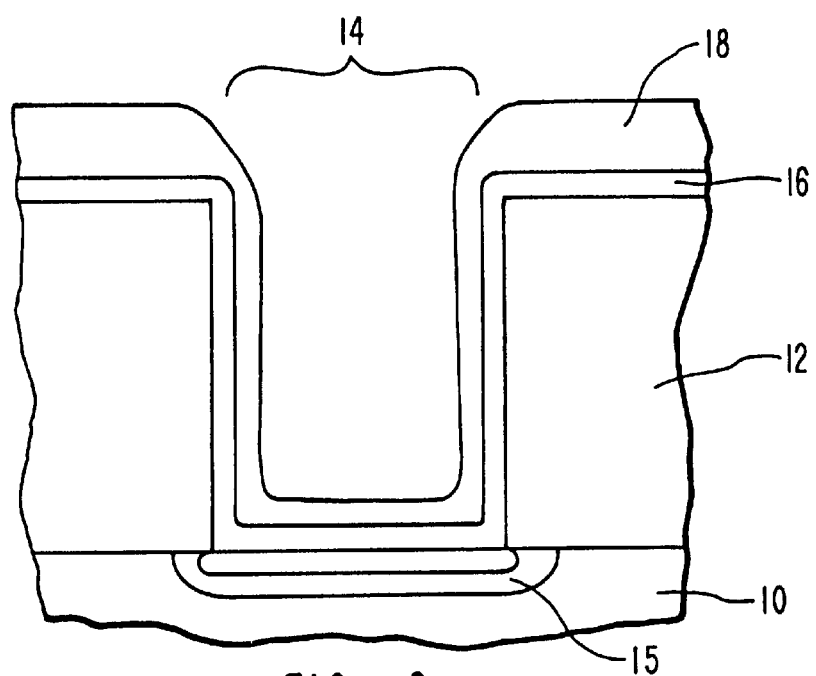
FIG. 6 is a schematic cross-sectional representation of a contact opening showing the results of the process of the present invention, where cusping at the surface of the contact opening is reduced.

Applying a voltage bias to in-process integrated circuit wafer 26 during deposition also tends to reduce built up configurations of sputtered material 25, such as cusps 18 of FIG. 1 that occur around contact openings. Thus, by reducing this the incidence of cusping, step coverage can be improved. This results in a consistent thickness of a film deposited over geometrical features such as contact opening 14, as shown in FIG. 6. Therein, it can be seen that cusps have not formed on the surface of contact opening 14 and sputtered material 25 has been deposited in a uniform manner. Consequently, the problem of formation of keyholes, such as keyhole 20 of FIG. 1, has also been avoided.

After the sputter deposition is conducted, in-process integrated circuit wafer 26 is removed and collimator 28 is cleaned. The cleaning of collimator 28 is conducted as discussed above, by applying a negative voltage bias to collimator 28 by closing switch S1, applying a positive voltage to electrode 40, and flowing an inert gas into the chamber. The cleaning operation can be conducted after each sputter operation, or at intervals as needed. Regular cleaning serves to maintain the step coverage of films being deposited over geometrical features formed on surface 45 within a constant and uniform range. Uniform step coverage is maintained because the average angle of incidence of ions 42 during each sputter deposition operation will not vary significantly due to the absence of buildup of sputtered material 25 on collimator 28. Also, the manufacturing process does not, as a result, have to be shut down periodically to clean or replace collimator 28. Consequently, a high throughput can be maintained.

The ability to vary the voltage biases between target 24, in-process integrated circuit wafer 26, and collimator 28 adds flexibility and greater capability of the deposition and preclean processes. For instance, each of the target 24, in-process integrated circuit wafer 26, and collimator 28 can be connected as shown in FIG. 5, so that each can have both a positive or negative potential applied thereto. Thereby, the location of the ionization plasma can be controlled and located either close to target 24 or close to in-process integrated circuit wafer 26 in order to effectively and efficiently conduct a sputter operation on one or the other.

Thus, a process is provided whereby the throughput of the integrated circuit manufacturing process is increased, and whereby the space and equipment in the clean room are reduced. Also, the morphology of the deposited film is controllable, consistent step coverage of the deposited film is maintained by reducing cusping, and throughput is increased by eliminating the need to manually clean or replace the collimator frequently.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of forming an apparatus for cleaning a surface on an in-process integrated circuit wafer, the method comprising:

providing in a PVD deposition chamber:
a target composed of a conducting material;
a collimator; and
a wafer holder for holding an integrated circuit in-process integrated circuit wafer;

providing electrical connections from a power source to each of the target and the wafer holder for applying a voltage bias to the target and to the wafer holder;

providing connections for electrically connecting and for electrically isolating the collimator from the target and from the wafer holder; and providing an electrode, in the PVD deposition chamber, for controlling the location of an ionization plasma with respect to the target and the wafer holder.

2. The method as recited in claim 1, further comprising electrical connections from a power source to the collimator for applying a voltage bias to the collimator.

3. The method as recited in claim 1, further comprising providing electrical controls for the power source, the target, and the wafer holder for:

simultaneously applying a voltage bias to both the target and the wafer holder by the power source; and adjusting the ratio of the voltage biases on the wafer holder and the target to control at least one desired morphology quality of a film of the conducting material of the target sputter deposited in the PVD deposition chamber from the target in an atmosphere of ionized inert gas.

4. The method as recited in claim 1, wherein the electrical connections to each of the target and the wafer holder from the power source for applying a voltage bias to the target and to the wafer holder is capable of simultaneously applying a voltage bias to both the collimator and the wafer holder.

5. The method as recited in claim 1, wherein a voltage source is in electrical communication with the wafer holder to thereby provide the capability of applying a voltage bias to the wafer holder so as to clean impurities off of a surface of an in-process integrated circuit wafer in electrical communication with and being retained by the wafer holder.

6. The method as recited in claim 1, wherein a voltage source is in electrical communication with the wafer holder to thereby provide the capability of applying a voltage bias to the target and sputtering the conducting material from the target onto an in-process integrated circuit wafer in electrical communication with and being retained by the wafer holder.

7. The method as recited in claim 1, wherein a voltage source is in electrical communication with the wafer holder to thereby provide the capability of applying a voltage bias to the collimator and to clean accumulations of the conducting material of the target off of the collimator.

8. The method as recited in claim 1, wherein the electrical connections to each of the target and the wafer holder from the power source for applying a voltage bias to the target and to the wafer holder is capable of simultaneously applying a negative voltage bias to the wafer holder and a positive voltage bias to the collimator in order to confine an ionization plasma close to an in-process integrated circuit wafer in electrical communication with and being retained by the wafer holder.

9. A method of forming an apparatus for cleaning a surface on an in-process integrated circuit wafer, the method comprising:
   providing in a PVD deposition chamber:
      a target composed of a conducting material;
      a collimator; and
      a wafer holder for holding an integrated circuit in-process integrated circuit wafer;
   providing electrical connections to each of the target, the collimator, the wafer holder, and a voltage source for applying a voltage bias to any of the target, the collimator, and the wafer holder;
   providing connections for electrically connecting and for electrically isolating the collimator from each of the target, the wafer holder, and a voltage source;
   providing electrical controls for applying a voltage bias to both the target and the wafer holder simultaneously so that the proportions of the voltage bias on the target and wafer holder are adjustable in order to control at least one desired morphology quality of a film of the conducting material sputter deposited from the target onto a surface of the integrated circuit in-process integrated circuit wafer in an atmosphere of an ionized inert gas; and
   providing an electrode, in the PVD deposition chamber, for controlling the location of an ionization plasma with respect to the target and the wafer holder.

10. A method of forming an apparatus for cleaning a surface on an in-process integrated circuit wafer, the method comprising:
   providing in a PVD deposition chamber:
      a target composed of a conducting material;
      a collimator; and
      a wafer holder for holding an integrated circuit in-process integrated circuit wafer;
   providing electrical connections from a voltage source to each of the target, the collimator, and the wafer holder such that:
      a voltage bias is capable of being simultaneously applied to both the target and the wafer holder;
      a voltage bias is capable of being applied to the collimator; and
      the ratio of the voltage biases on the wafer holder and the target are adjustable in order to control at least one desired morphology quality of a film of the conducting material of the target sputter deposited in the PVD deposition chamber from the target in an atmosphere of ionized inert gas;
   providing connections for electrically connecting and for electrically isolating the collimator from each of the target and the wafer holder; and
   providing an electrode, in the PVD deposition chamber, for controlling the location of an ionization plasma with respect to the target and the wafer holder.

11. The method as recited in claim 10, wherein the electrical connections from the voltage source to each of the target, the collimator, and the wafer holder are such that a voltage bias can be applied simultaneously applying to both the collimator and the wafer holder.

12. The method as recited in claim 10, wherein the electrical connections from the voltage source to each of the target, the collimator, and the wafer holder can simultaneously apply:
   a negative voltage bias to the wafer holder; and
   a positive voltage bias to the collimator;
whereby an ionization plasma can be confined close to an in-process integrated circuit wafer in electrical communication with and being retained by the wafer holder.

13. A method of forring an apparatus for cleaning a surface on an in-process integrated circuit wafer, the method comprising:
   providing in a PVD deposition chamber:
      a target composed of a conducting material;
      a collimator; and
      a wafer holder for holding an integrated circuit in-process integrated circuit wafer;
   providing electrical connections and controls from a power source to each of the target, the collimator, and the wafer holder for:
      applying a voltage bias to the target and to the wafer holder; and
      sputtering the conducting material from the target onto an in-process integrated circuit wafer in electrical communication with and being retained by the wafer holder;
      applying a voltage bias simultaneously to both the target and the wafer holder such that the ratio of the voltage biases on the wafer holder and the target are adjustable in order to control at least one desired morphology quality of a film of the conducting material of the target sputter deposited in the PVD deposition chamber from the target in an atmosphere of ionized inert gas;
      electrically isolating the collimator from the power source, the target, and the wafer holder;
      providing an electrode, in the PVD deposition chamber, for controlling the location of an ionization plasma with respect to the target and the wafer holder; and
      providing electrical connections for applying a voltage bias to the collimator.

14. The method as recited in claim 13, wherein the electrical connections and controls from the power source to each of the target, the collimator, and the wafer holder are capable of simultaneously applying a voltage bias to both the collimator and the wafer holder.

15. The method as recited in claim 13, wherein the electrical connections and controls from the power source to each of the target, the collimator, and the wafer holder are capable of simultaneously applying a negative voltage bias to the wafer holder and a positive voltage bias to the collimator in order to confine an ionization plasma close to an in-process integrated circuit wafer in electrical communication with and being retained by the wafer holder.

16. A method of forming an apparatus for cleaning a surface on an in-process integrated circuit wafer, the method comprising:

providing in a PVD deposition chamber:
  a target composed of a conducting material;
  a collimator; and
  a wafer holder for holding an integrated circuit in-process integrated circuit wafer;
providing electrical controls and connections from a power source to each of the target, the collimator, and the wafer holder for:
  applying a voltage bias simultaneously to both the target and to the wafer holder;
  applying a voltage bias to the collimator and to clean accumulations of the conducting material of the target off of the collimator, wherein the ratio of the voltage biases on the wafer holder and the target are adjustable in order to control at least one desired morphology quality of a film of the conducting material of the target sputter deposited in the PVD deposition chamber from the target in an atmosphere of ionized inert gas;
  electrically isolating the collimator from the power source, the target, and the wafer holder; and
  providing an electrode, in the PVD deposition chamber, for controlling the location of an ionization plasma with respect to the target and the wafer holder.

17. The method as recited in claim 16, wherein the electrical controls and connections from the power source to each of the target, the collimator, and the wafer holder are capable of simultaneously applying a voltage bias to both the collimator and the wafer holder.

18. The method as recited in claim 16, wherein the electrical controls and connections from the power source to each of the target, the collimator, and the wafer holder are capable of simultaneously applying a negative voltage bias to the wafer holder and a positive voltage bias to the collimator in order to confine an ionization plasma close to an in-process integrated circuit wafer in electrical communication with and being retained by the wafer holder.

19. A method of forming an sputtering apparatus, the method comprising:
  providing in a chamber:
    a target composed of a conducting material;
    a collimator; and
    a substrate holder for holding an in-process integrated circuit substrate;
  providing electrical controls and connections from a power source to each of the target, the collimator, and the wafer holder for:
    applying a voltage bias to any of the target, the collimator, and the substrate holder; and
    electrically isolating the collimator from the power source, the target, and the wafer holder;
    applying a voltage bias simultaneously to both the target and the substrate holder so that the proportions of the voltage bias on the target and substrate holder are adjustable in order to control at least one desired morphology quality of a film of the conducting material sputter deposited from the target onto a surface of a substrate held by the substrate holder; and
  providing an electrode, in the PVD deposition chamber, for controlling the location of an ionization plasma with respect to the target and the wafer holder.

20. A method of forming a sputtering apparatus, the method comprising:
  providing in a chamber:
    a target composed of a conducting material;
    a member having a plurality of openings therein; and
    a substrate holder for holding a substrate;
  providing electrical controls and connections from the target, the member, and the substrate holder for:
    applying a voltage bias to the target and to the substrate holder;
    electrically isolating the member from the target and the substrate holder; and
  providing an electrode, in the PVD deposition chamber, for controlling the location of an ionization plasma with respect to the target and the substrate holder;
  whereby the conducting material can be sputtered from the target through the member towards the substrate holder.

21. An apparatus for cleaning a surface on an in-process integrated circuit substrate, the apparatus comprising:
  a chamber;
  a target composed of a conducting material disposed in the chamber;
  a collimator disposed in the chamber;
  a substrate holder disposed in the chamber; and
  an electrical circuit including a first electrical connection, a second electrical connection, and a third electrical connection, wherein:
    said first electrical connection is in electrical communication with each of the target, the collimator, and the substrate holder;
    the first electrical connection is for applying a voltage bias to the target and to the substrate holder;
    said second electrical connection is in electrical communication with the first electrical connection and is for electrically isolating the collimator from the first electrical connection; and
    said third electrical connection is situated in the chamber and is for controlling the location of an ionization plasma with respect to the target and the substrate holder.

22. An apparatus as recited in claim 21, wherein said electrical circuit further comprising a fourth electrical connection in electrical communication with the first electrical connection for applying a voltage bias to the collimator.

23. An apparatus as recited in claim 21, wherein:
  a voltage bias is capable of being simultaneously applied to both the target and the substrate holder by the first electrical connection;
  the ratio of the voltage biases on the substrate holder and the target are adjustable in order to control at least one desired morphology quality of a film of the conducting material of the target sputter deposited in the chamber from the target in an atmosphere of ionized inert gas.

24. An apparatus as recited in claim 21, wherein the first electrical connection is capable of simultaneously applying a voltage bias to both the collimator and the substrate holder.

25. An apparatus as recited in claim 21, wherein a voltage source is in electrical communication with the substrate holder to thereby provide the capability of applying a voltage bias to the substrate holder so as to clean impurities off of a surface of an in-process integrated circuit substrate in electrical communication with and being retained by the substrate holder.

26. An apparatus as recited in claim 21, wherein a voltage source is in electrical communication with the substrate holder to thereby provide the capability of applying a voltage bias to the target and sputtering the conducting material from the target onto an in-process integrated circuit substrate in electrical communication with and being retained by the substrate holder.

27. An apparatus as recited in claim 21, wherein a voltage source is in electrical communication with the substrate holder to thereby provide the capability of applying a voltage bias to the collimator and to clean accumulations of the conducting material of the target off of the collimator.

28. An apparatus as recited in claim 21, wherein the first electrical connection is capable of simultaneously applying a negative voltage bias to the substrate holder and a positive voltage bias to the collimator in order to confine an ionization plasma close to an in-process integrated circuit substrate in electrical communication with and being retained by the substrate holder.

29. An apparatus for cleaning a surface on an integrated circuit in-process integrated circuit wafer, the apparatus comprising:
   a PVD deposition chamber having therein a target composed of a conducting material, a collimator, and a wafer holder; and
   an electrical circuit including a first electrical connection and a second electrical connection, wherein:
      said first electrical connection is in electrical communication with each of the target, the collimator, and the wafer holder;
      the first electrical connection is in electrical communication with a voltage source and is capable of applying a voltage bias to any of the target, the collimator, and the wafer holder;
      said second electrical connection is in electrical communication with the first electrical connection and is for electrically isolating the collimator from the first electrical connection; and
      a voltage bias can be applied by the first electrical connection to both the target and the wafer holder simultaneously so that the proportions of the voltage bias on the target and wafer holder are adjustable in order to control at least one desired morphology quality of a film of the conducting material sputter deposited from the target onto a surface of the integrated circuit in-process integrated circuit wafer in an atmosphere of an ionized inert gas.

30. An apparatus for cleaning a surface on an in-process integrated circuit wafer, the apparatus comprising:
   a PVD deposition chamber;
   a target composed of a conducting material disposed in the PVD deposition chamber;
   a collimator disposed in the PVD deposition chamber;
   a wafer holder disposed in the PVD deposition chamber;
   an electrical circuit including a first electrical connection, a second electrical connection, a third electrical connection, and a fourth electrical connection, wherein:
      said first electrical connection is in electrical communication with each of the target, the collimator, and the wafer holder;
      the first electrical connection is for applying a voltage bias to the target and to the wafer holder;
      a voltage bias is capable of being simultaneously applied to both the target and the wafer holder by the first electrical connection;
      the ratio of the voltage biases on the wafer holder and the target are adjustable in order to control at least one desired morphology quality of a film of the conducting material of the target sputter deposited in the PVD deposition chamber from the target in an atmosphere of ionized inert gas;
      said second electrical connection is in electrical communication with the first electrical connection and is for electrically isolating the collimator from the first electrical connection;
      said third electrical connection is situated in the PVD deposition chamber and is for controlling the location of an ionization plasma with respect to the target and the wafer holder; and
      said fourth electrical connection is in electrical communication with the first electrical connection and is for applying a voltage bias to the collimator.

31. An apparatus as recited in claim 30, wherein the first electrical connection is capable of simultaneously applying a voltage bias to both the collimator and the wafer holder.

32. An apparatus as recited in claim 30, wherein the first electrical connection is capable of simultaneously applying a negative voltage bias to the wafer holder and a positive voltage bias to the collimator in order to confine an ionization plasma close to an in-process integrated circuit wafer in electrical communication with and being retained by the wafer holder.

33. An apparatus for cleaning a surface on an in-process integrated circuit wafer, the apparatus comprising:
   a PVD deposition chamber;
   a target composed of a conducting material disposed in the PVD deposition chamber;
   a collimator disposed in the PVD deposition chamber; and
   a wafer holder disposed in the PVD deposition chamber;
   an electrical circuit including a first electrical connection, a second electrical connection, a third electrical connection, and a fourth electrical connection, wherein:
      said first electrical connection is in electrical communication with each of the target, the collimator, and the wafer holder;
      the first electrical connection is for applying a voltage bias to the target and to the wafer holder;
      the first electrical connection is in electrical communication with a voltage source that is in electrical communication with the wafer holder to thereby provide the capability of applying a voltage bias to the target and sputtering the conducting material from the target onto an in-process integrated circuit wafer in electrical communication with and being retained by the wafer holder;
      a voltage bias is capable of being simultaneously applied to both the target and the wafer holder by the first electrical connection;
      the ratio of the voltage biases on the wafer holder and the target are adjustable in order to control at least one desired morphology quality of a film of the conducting material of the target sputter deposited in the PVD deposition chamber from the target in an atmosphere of ionized inert gas;
      said second electrical connection is in electrical communication with the first electrical connection and is for electrically isolating the collimator from the first electrical connection;
      said third electrical connection is situated in the PVD deposition chamber and is for controlling the location of an ionization plasma with respect to the target and the wafer holder; and
      said fourth electrical connection is in electrical communication with the first electrical connection and is for applying a voltage bias to the collimator.

34. An apparatus as recited in claim 33, wherein the first electrical connection is capable of simultaneously applying a voltage bias to both the collimator and the wafer holder.

35. An apparatus as recited in claim 33, wherein the first electrical connection is capable of simultaneously applying a negative voltage bias to the wafer holder and a positive voltage bias to the collimator in order to confine an ionization plasma close to an in-process integrated circuit wafer in electrical communication with and being retained by the wafer holder.

36. An apparatus for cleaning a surface on an in-process integrated circuit wafer, the apparatus comprising:

a PVD deposition chamber;

a target composed of a conducting material disposed in the PVD deposition chamber;

a collimator disposed in the PVD deposition chamber;

a wafer holder disposed in the PVD deposition chamber; and an electrical circuit including a first electrical connection, a second electrical connection, a third electrical connection, and a fourth electrical connection, wherein:

said first electrical connection is in electrical communication with each of the target, the collimator, and the wafer holder;

said first electrical connection is for applying a voltage bias to the target and to the wafer holder;

the first electrical connection is in electrical communication with a voltage source that is in electrical communication with the wafer holder to thereby provide the capability of applying a voltage bias to the collimator and to clean accumulations of the conducting material of the target off of the collimator;

a voltage bias is capable of being simultaneously applied to both the target and the wafer holder by the first electrical connection; and the ratio of the voltage biases on the wafer holder and the target are adjustable in order to control at least one desired morphology quality of a film of the conducting material of the target sputter deposited in the PVD deposition chamber from the target in an atmosphere of ionized inert gas;

said second electrical connection is in electrical communication with the first electrical connection and is for electrically isolating the collimator from the first electrical connection;

said third electrical connection is situated in the PVD deposition chamber and is for controlling the location of an ionization plasma with respect to the target and the wafer holder; and said fourth electrical connection is in electrical communication with the first electrical connection and is for applying a voltage bias to the collimator.

37. An apparatus as recited in claim 36, wherein the first electrical connection is capable of simultaneously applying a voltage bias to both the collimator and the wafer holder.

38. An apparatus as recited in claim 36, wherein the first electrical connection is capable of simultaneously applying a negative voltage bias to the wafer holder and a positive voltage bias to the collimator in order to confine an ionization plasma close to an in-process integrated circuit wafer in electrical communication with and being retained by the wafer holder.

39. An apparatus comprising:

a chamber having therein a target composed of a conducting material, a collimator, and a substrate holder; and an electrical circuit including a first electrical connection and a second electrical connection, wherein:

said first electrical connection is in electrical communication with each of the target, the collimator, and the substrate holder, the first electrical connection being in electrical communication with a voltage source and being capable of applying a voltage bias to any of the target, the collimator, and the substrate holder; and said second electrical connection is in electrical communication with the first electrical connection and is for electrically isolating the collimator from the first electrical connection; and a voltage bias can be applied by the first electrical connection to both the target and the substrate holder simultaneously so that the proportions of the voltage bias on the target and substrate holder are adjustable in order to control at least one desired morphology quality of a film of the conducting material sputter deposited from the target onto a surface of a substrate.

* * * * *

UNITED STATES PATENT AND TRADEMARK OFFICE
CERTIFICATE OF CORRECTION

PATENT NO. : 6,267,852 B1
DATED : July 31, 2001
INVENTOR(S) : John H. Givens; Shane B. Leiphart It is certified that error appears in the above-identified patent and that said Letters Patent is hereby corrected as shown below:

Column 1,
Line 5, after "1998," insert -- now --
Line 5, after "6,051,121" insert -- , --
Line 7, after "1996," insert -- now --
Line 7, after "5,807,467" insert -- , --
Line 16, after "corresponding" change "cleaning" to -- precleaning --

Column 2,
Line 23, after "mentioned" insert -- . --
Line 52, before "eliminated." change "b" to -- be --

Column 3,
Line 11, after "step" change "old" to -- of --

Column 4,
Line 46, after "circuit" change "safer" to -- wafer --
Line 48, after "deposited" insert -- . --
Line 50, after "invention" insert -- . --
Line 67, change "hereby" to -- thereby --

Column 5,
Line 56, after "collimator" insert -- . --

Column 6,
Line 11, after "electrical" change "Circuit" to -- circuit --
Line 18, before "voltage" change "appositive" to -- a positive --
Line 21, change "cimator" to -- collimator --

Column 7,
Line 11, after "collimator" insert -- 28 --

Column 8,
Line 27, before "integrated" change "inprocess" to -- in-process --
Line 39, change "iQnization" to -- ionization --
Line 44, change "large,voltage" to -- large voltage --
Line 53, after "adhere" insert -- . --
Line 62, change "ctne" to -- one --
Line 66, after "switch" change "SI." to -- S1. --

UNITED STATES PATENT AND TRADEMARK OFFICE
CERTIFICATE OF CORRECTION

PATENT NO.   : 6,267,852 B1
DATED        : July 31, 2001
INVENTOR(S)  : John H. Givens; Shane B. Leiphart It is certified that error appears in the above-identified patent and that said Letters Patent is hereby corrected as shown below:

Column 9,
Line 19, change "P I" to -- P1 --

Column 12,
Line 20, change "forring" to -- forming --

Column 14,
Line 67, change "bythe" to -- by the --

Signed and Sealed this

Fifth Day of March, 2002

Attest:

JAMES E. ROGAN
*Attesting Officer*       *Director of the United States Patent and Trademark Office*